(12) United States Patent
Lin et al.

(10) Patent No.: US 11,561,632 B2
(45) Date of Patent: Jan. 24, 2023

(54) ELECTRONIC DEVICE

(71) Applicant: InnoLux Corporation, Miao-Li County (TW)

(72) Inventors: Hsiao-Lang Lin, Miao-Li County (TW); Kuan-Feng Lee, Miao-Li County (TW); Jia-Yuan Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 143 days.

(21) Appl. No.: 17/009,738

(22) Filed: Sep. 1, 2020

(65) Prior Publication Data
US 2021/0109617 A1  Apr. 15, 2021

(30) Foreign Application Priority Data

Oct. 9, 2019 (CN) .......................... 201910955060.1

(51) Int. Cl.
| | |
|---|---|
| *G06F 3/041* | (2006.01) |
| *H01L 27/32* | (2006.01) |
| *H01L 51/52* | (2006.01) |
| *H01L 25/075* | (2006.01) |
| *H01L 33/50* | (2010.01) |
| *H01L 33/58* | (2010.01) |
| *H01L 33/60* | (2010.01) |
| *H01L 27/12* | (2006.01) |
| *G06F 3/044* | (2006.01) |

(52) U.S. Cl.
CPC ........ *G06F 3/0412* (2013.01); *H01L 25/0753* (2013.01); *H01L 27/1214* (2013.01); *H01L 27/322* (2013.01); *H01L 27/323* (2013.01); *H01L 27/3244* (2013.01); *H01L 33/507* (2013.01); *H01L 33/58* (2013.01); *H01L 33/60* (2013.01); *H01L 51/5284* (2013.01); *G06F 3/0443* (2019.05); *G06F 3/0445* (2019.05); *G06F 3/0446* (2019.05)

(58) Field of Classification Search
CPC .... G06F 3/0412; G06F 3/0443; G06F 3/0445; G06F 3/0446; H01L 25/0753; H01L 27/1214; H01L 27/322; H01L 27/323; H01L 27/3244; H01L 33/507; H01L 33/58; H01L 33/60; H01L 51/5284; H01L 33/50; H01L 25/167
See application file for complete search history.

(56) References Cited

U.S. PATENT DOCUMENTS

| | | | |
|---|---|---|---|
| 2018/0188590 A1* | 7/2018 | Gu | .................... G02F 1/133504 |
| 2019/0129525 A1 | 5/2019 | Jeong | |
| 2020/0089356 A1* | 3/2020 | Qi | ......................... G02F 1/1368 |
| 2020/0194504 A1* | 6/2020 | Xu | ....................... H01L 27/322 |

* cited by examiner

*Primary Examiner* — Kevin Quarterman
(74) *Attorney, Agent, or Firm* — Winston Hsu

(57) ABSTRACT

An electronic device includes a light emitting structure, at least one touch structure and at least two adjacent light conversion structures. The at least one touch structure is disposed on the light emitting structure, and the at least one touch structure is between two adjacent light conversion structures.

5 Claims, 12 Drawing Sheets

ELECTRONIC DEVICE

CROSS REFERENCE TO RELATED APPLICATION

This application claims the priority benefit of China application serial No. 201910955060.1, filed Oct. 9, 2019. The entirety of the above-mentioned patent application is incorporated herein by reference and made a part of this specification.

BACKGROUND OF THE DISCLOSURE

1. Field of the Disclosure

The present disclosure relates to an electronic device, and more particularly to an electronic device having a touch structure and a light conversion structure.

2. Description of the Prior Art

Nowadays, many electronic devices need to have a touch sensing function. For instance, notebooks, tablet computers, smart phones, watches, or display devices in vehicles are developed to have the (touch) sensing function. However, there are still many parts for improvement in integration of a panel and a (touch) sensing component at present.

SUMMARY OF THE DISCLOSURE

The present disclosure provides many electronic devices of which a touch structure and a light conversion structure are integrated into a panel, so as to reduce a thickness or a cost of the electronic device, or improve a touch sensing function of the electronic device.

According to an embodiment, the present disclosure provides an electronic device including a light emitting structure, at least one touch structure and at least two adjacent light conversion structures. The at least one touch structure is disposed on the light emitting structure, and at least one touch structure is between the at least two adjacent light conversion structures.

DETAILED DESCRIPTION

Figure 1:
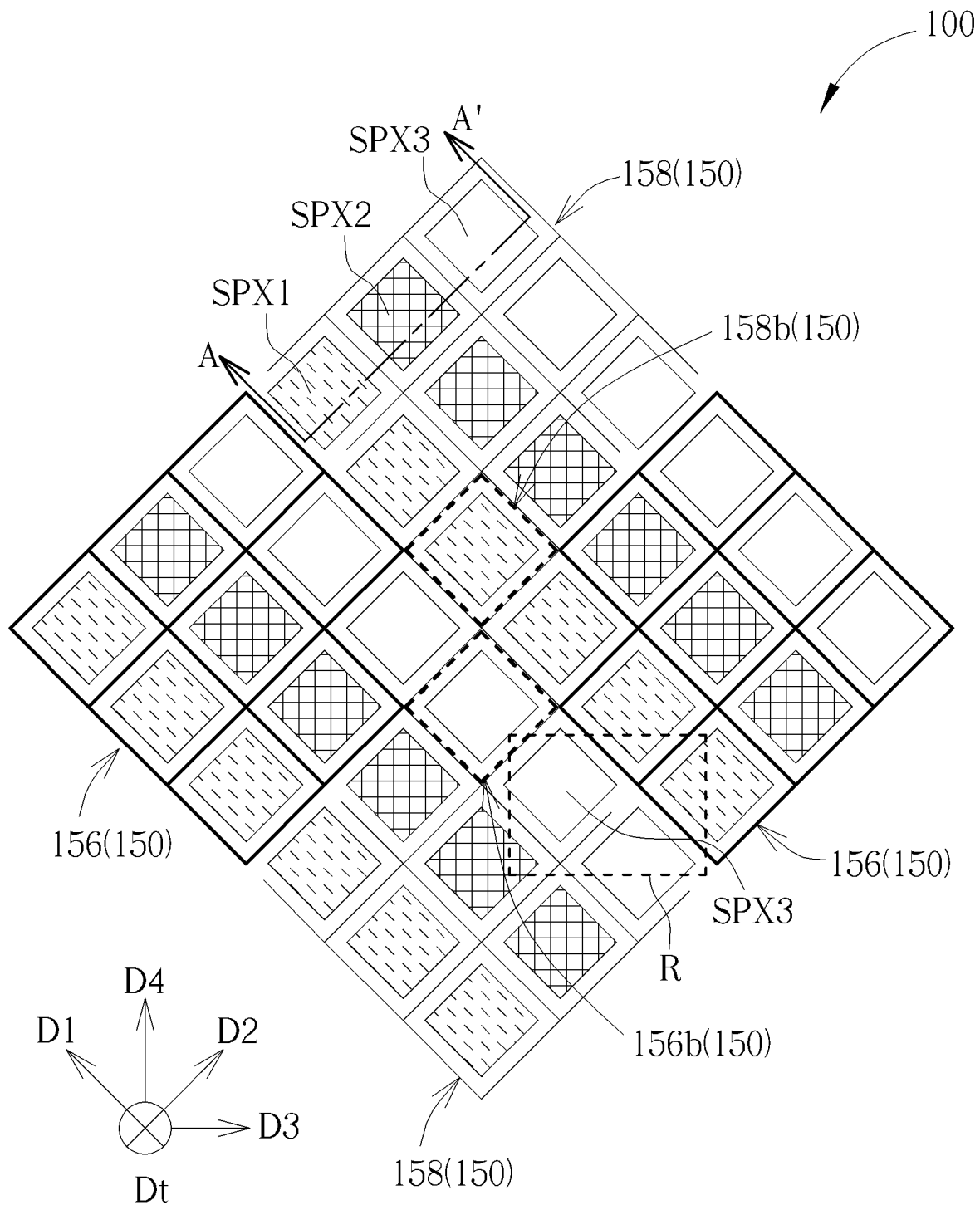
FIG. 1 is a schematic diagram showing a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The directional terms used throughout the description and following claims, such as: "on", "up", "above", "down", "under", "below", "underneath", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component(s) may exist between them. On the other hand, when the component is referred to "directly on another component (or the variant thereof)", any component does not exist between them. Furthermore, when the corresponding component is referred to "on another component", the corresponding component and the another component have a disposition relationship along a top-view direction, the corresponding component may be below or above the another component, and the disposition relationship along the top-view direction are determined by an orientation of the device.

It will be understood that when a component or layer is referred to as being "connected to" another component or layer, it can be directly connected to this another component or layer, or intervening components or layers may be presented. When a component is referred to as being "directly connected to" another component or layer, there are no intervening components or layers presented. In addition, when the component is referred to "be coupled to/with another component (or the variant thereof)", it may be directly connected to this another component, or may be indirectly connected (such as electrically connected) to this another component through other component(s).

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the electronic device may include a touch device, a display device, an antenna device, a light emitting device, a tiled device, other suitable electronic device or a combination thereof, but not limited thereto. The electronic device may include an organic light-emitting diode (OLED), an inorganic light-emitting diode (LED) such as a micro-LED and/or a mini-LED, quantum dots (QDs) material, a quantum-dot light-emitting diode (QLED, QDLED), fluorescence material, phosphor material, other suitable material or a combination thereof, but not limited thereto. Moreover, the electronic device may be a color display device or a monochrome display device, and a shape of the electronic device may be a rectangle, a circle, a polygon, a shape having a curved edge or other suitable shape, but not limited thereto. In the following, in order to explain exemplarily, the electronic device may be a touch display device displaying a color image as an example, but the electronic device is not limited thereto.

Figure 2:
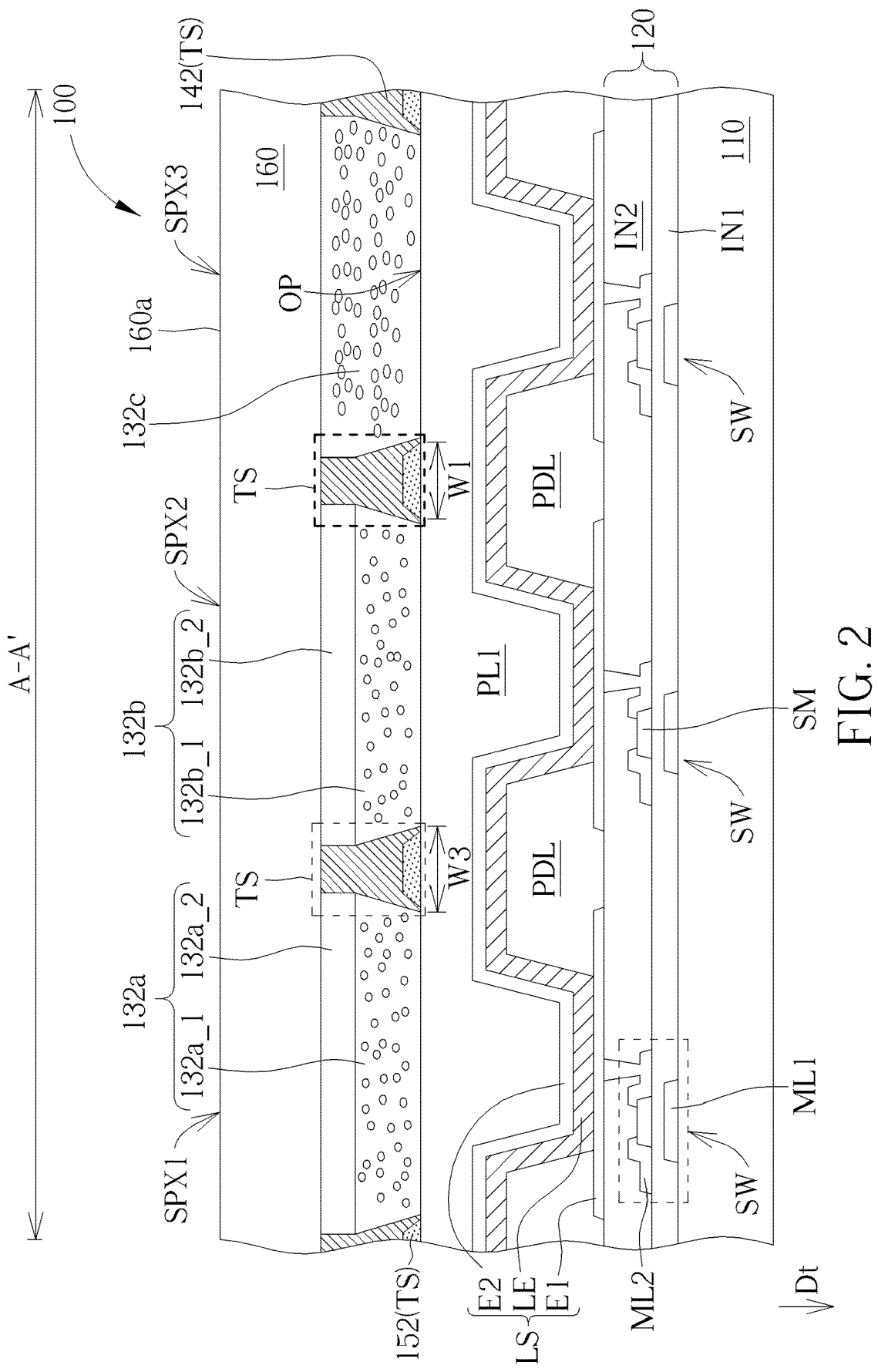
FIG. 2 is a schematic diagram showing a cross-sectional view of the electronic device taken along a cross-sectional line A-A' in FIG. 1 according to the first embodiment of the present disclosure.
Figure 3:
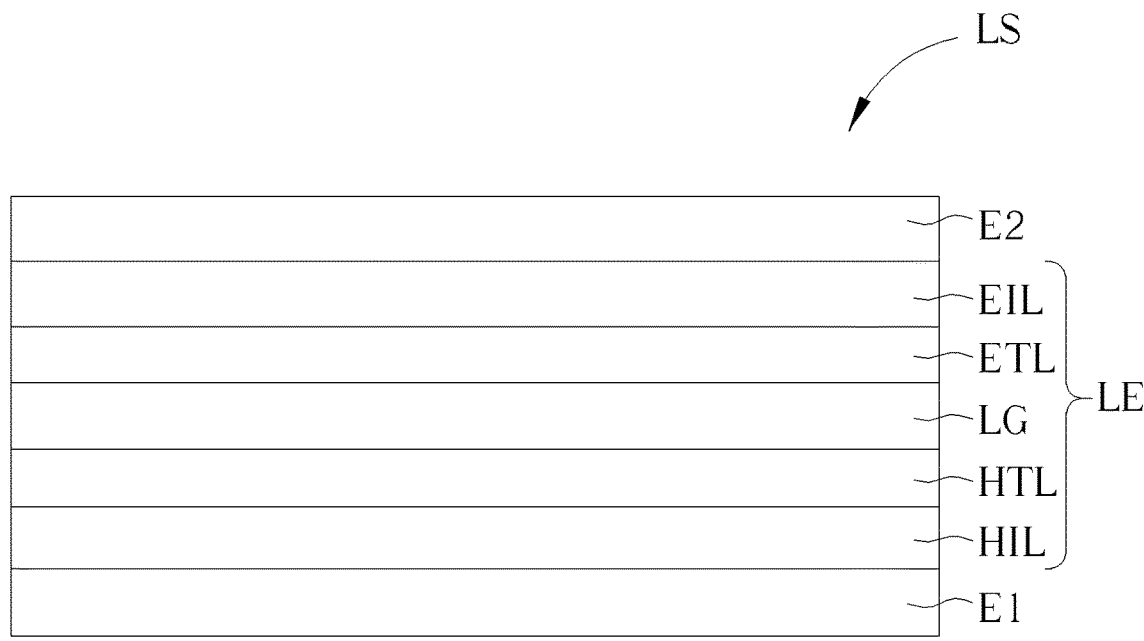
FIG. 3 is a schematic diagram showing a cross-sectional view of a light emitting structure according to the first embodiment of the present disclosure.
Figure 4:
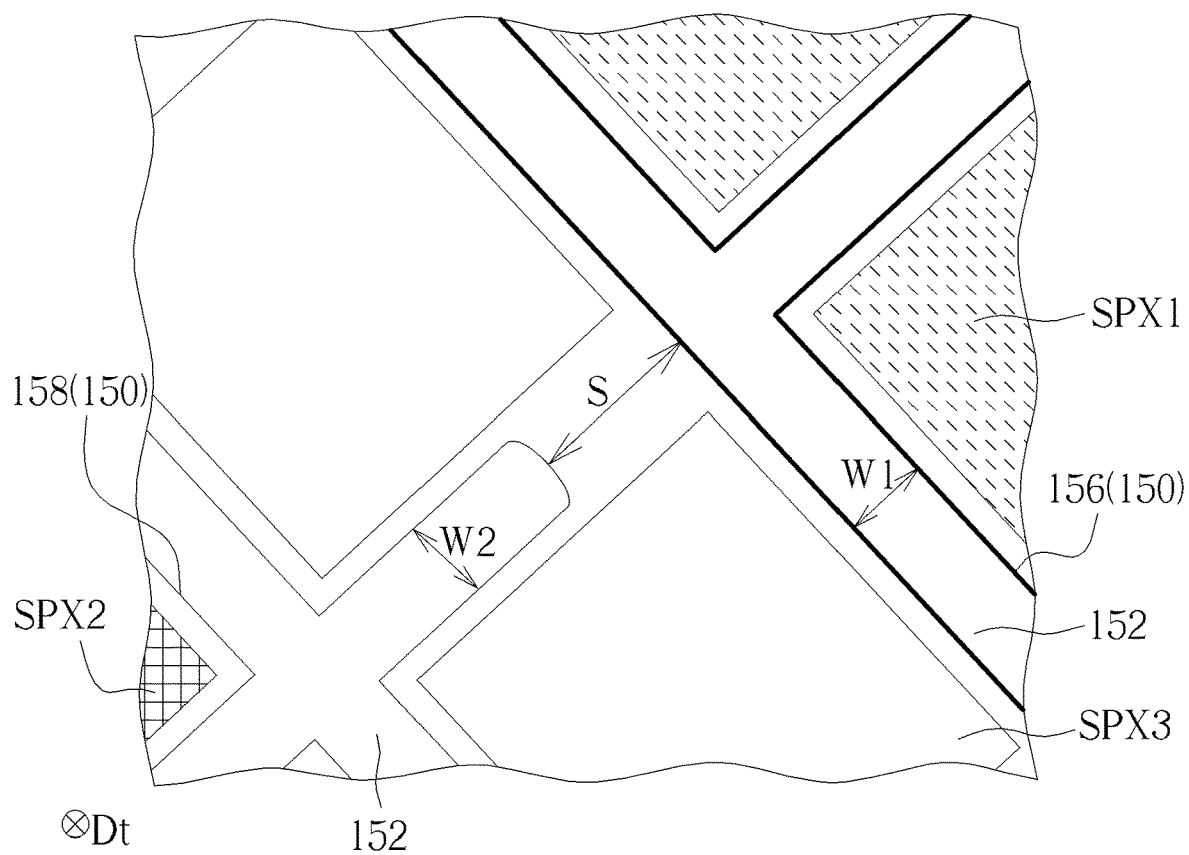
FIG. 4 is an enlarge diagram showing a touch layer in a region R of FIG. 1.

FIG. 1 is a schematic diagram showing a top view of an electronic device according to a first embodiment of the present disclosure, FIG. 2 is a schematic diagram showing a cross-sectional view of the electronic device taken along a cross-sectional line A-A' in FIG. 1 according to the first embodiment of the present disclosure, FIG. 3 is a schematic diagram showing a cross-sectional view of a light emitting structure according to the first embodiment of the present disclosure, and FIG. 4 is an enlarge diagram showing a touch layer in a region R of FIG. 1. As shown in FIG. 1 and FIG. 2, the electronic device 100 includes a first substrate 110, a circuit component layer 120, at least one light emitting structure LS, a plurality of light conversion structures (e.g., 132a, 132b and/or 132c) and at least one touch structure TS, but not limited thereto. In some embodiments, the electronic device 100 may optionally include an element such as a cover layer 160 or a second substrate (referring to following embodiments), but not limited thereto. In some embodiments (as shown in FIG. 2), the touch structure TS may be a composite layer structure. For example, the at least one touch structure TS includes at least one touch layer (e.g., a first touch layer 152) and at least one light blocking layer (142), but not limited thereto.

In some embodiments, the material(s) of the first substrate 110 may include glass, quartz, ceramic, sapphire, polyimide (PI), polyethylene terephthalate (PET), other suitable material or a combination thereof, but not limited thereto. In some embodiments, the first substrate 110 may include a rigid substrate, a soft substrate or a flexible substrate. In some embodiments, the cover layer 160 may include transparent material, insulating material, other suitable material or a combination thereof. In some embodiments, the cover layer 160 may have a protecting characteristic, a blocking characteristic of water and/or oxygen, a buffer characteristic or a combination thereof, but not limited thereto. In some embodiments, the cover layer 160 may include a single-layer structure or a composite layer structure, wherein the cover layer 160 include an inorganic insulating layer, an organic insulating layer or a combination thereof, but not limited thereto. In some embodiments (as shown in FIG. 1), for instance, the electronic device 100 emits the light upwardly, an outer surface 160a of the cover layer 160 may be a light-emitting surface of the electronic device 100 (i.e., a surface which the user views the display image), and the outer surface 160a of the cover layer 160 may be a surface for touch, but not limited thereto.

In some embodiments, the electronic device 100 may include an active region (not shown in figures) and a peripheral region (not shown in figures), the peripheral region may be disposed adjacent to or surrounding the active region, wherein the active region may optionally include a display region, a sensing region, a light emitting region, a touch sensing region and/or a working region based on the use of the electronic device, but not limited thereto. For instance (as shown in FIG. 1), the electronic device 100 may be a display device, the electronic device 100 may include a plurality of pixels, the pixels may be composed of a plurality of sub-pixels, and the above display region may be a region including light emitting regions of all sub-pixels (the detailed explanation will be described in the following). In addition, the touch sensing region may be a region including all of touch structure(s) TS. In some embodiments, for example, the touch sensing region may overlap the display region in the top-view direction Dt. In some embodiments, the size of the touch sensing region may be greater than, equal to or less than the size of the display region.

In some embodiments, the electronic device 100 includes a controlling circuit (e.g., a chip) disposed on the peripheral region (not shown in figures), and the controlling circuit may be electrically connected to bonding pads (not shown in figures) of the circuit component layer 120, but not limited thereto.

In some embodiments, the color of the light provided from the sub-pixel may include green, red, blue, yellow or other color, and the color of the light provided from the sub-pixel may be designed based on requirement(s). In some embodiments (as shown in FIG. 1 or FIG. 2), each pixel may include three sub-pixels, such as a green sub-pixel SPX1, a red sub-pixel SPX2 and a blue sub-pixel SPX3, but not limited thereto. Note that the number and the arrangement of the pixels and/or the number and the arrangement of the sub-pixels shown in figures are only exemplary, and they may be designed based on requirement(s). In some embodiments (as shown in FIG. 1), the sub-pixels may be arranged in an array, but not limited thereto. Moreover, in the top-view direction Dt, the shape of the sub-pixel may include a rectangle, a parallelogram, a chevron, a curve or other suitable shape (the sub-pixel shown in FIG. 1 is a rectangle for example). The shape of the sub-pixel may be defined by a profile shape of the light emitting region of the sub-pixel projected to the first substrate 110, and the light emitting region of the sub-pixel may be defined by an opening OP of the light blocking layer (and this content will be explained later).

In some embodiments (as shown in FIG. 2), the sub-pixels (including SPX1, SPX2 and/or SPX3) may include at least one light emitting structure LS. The light emitting structure LS may include an OLED, a mini-LED, a micro-LED, other suitable light emitting structure or a combination thereof. The layer(s) in the light emitting structure LS may be adjusted based on the type of the light emitting structure LS. In some embodiments (as shown in FIG. 2), for example, the light emitting structure LS may be an OLED, the light emitting structure LS may include a first electrode E1 (e.g., an anode), a light-emitting layer LE and/or a second electrode E2 (e.g., a cathode), and the light-emitting layer LE is disposed between the first electrode E1 and the second electrode E2. In some embodiments (as shown in FIG. 2), for instance, a plurality of first electrodes E1 may be separated from each other, each first electrode E1 corresponds to one of the sub-pixels (including SPX1, SPX2 and SPX3), the light-emitting layers LE of the sub-pixels may be connected to each other to be a common light-emitting layer, and the second electrodes E2 of the sub-pixels may be connected to each other to be a common second electrode, but not limited thereto. Note that, although the sub-pixels use one common light emitting layer together, the light emitting regions of the light-emitting layers of the sub-pixels are the regions which the common light emitting layer overlap the first electrode E1 and the second electrode E2. In some embodiments (not shown), in the light emitting structures LS corresponding to different sub-pixels, the light-emitting layers LE (or the second electrodes E2) may be separated from each other for example, but not limited thereto.

In some embodiments, the light-emitting layer LE may be a single-layer structure or a multi-layer structure based on requirement(s). As shown in FIG. 2 and FIG. 3, the light-emitting layer LE may include a hole injection layer HIL, a hole transport layer HTL, an active layer LG an electron transport layer ETL and/or an electron injection layer EIL stacked on the first electrode E1 in sequence, but not limited thereto. In addition, the light-emitting layer LE may include at least one hole injection layer HIL, at least one hole transport layer HTL, at least one active layer LG at least one electron transport layer ETL and/or at least one electron injection layer EIL.

In some embodiments (as shown in FIG. 2), the sub-pixels (including SPX1, SPX2 and SPX3) may include at least one transistor such as a switching component SW, the switching component SW may be electrically connected to the corresponding light emitting structure LS. The sub-pixels may optionally include another component (e.g., other transistor, a capacitor). In FIG. 2, a gate of the switching component SW may be formed of a conductive layer ML1, a gate insulating layer may be formed of an insulating layer IN1, a channel structure may be formed of a semiconductor layer SM, and/or a source and/or a drain may be formed of a conductive layer ML2. In addition, at least one insulating layer IN2 may be disposed between the conductive layer ML2 and the light emitting structure LS (e.g., the first electrode E1), but not limited thereto. In some embodiments, based on requirement(s), the first electrode E1 and/or the second electrode E2 include metal, transparent conductive material (e.g., indium tin oxide (ITO), indium zinc oxide (IZO), etc.), other suitable conductive material or a combination thereof. In some embodiments, the electronic device may emit the light upwardly, the first electrode E1 may include metal to reflect the light emitted by the light-emitting layer LE, and the second electrode E2 may include the transparent conductive material, but not limited thereto.

In some embodiments (as shown in FIG. 2), the light conversion structures (e.g., 132a, 132b and/or 132c) may be optionally disposed based on the color of the light provided from the sub-pixel. For instance, each light conversion structure (e.g., 132a, 132b and/or 132c) may be disposed on the light emitting structure LS and corresponding to one of the sub-pixels. For example, the light conversion structures (e.g., 132a, 132b and/or 132c) may be more adjacent to the light-emitting surface of the electronic device 100 (e.g., the outer surface 160a of the cover layer 160) with respect to the light emitting structure LS. In some embodiments, the light conversion structure may include color filter material (e.g., a color resist), quantum dots material, fluorescence material, phosphor material, light scattering particles, other suitable light converting material or a combination thereof. In some embodiments, the light emitting structure LS is configured to emit an incident light including such as blue light, UV light or light with other suitable color (or other suitable wave band). For example, the light conversion structure 132a may be correspondingly disposed in the green sub-pixel SPX1, the light conversion structure 132b may be correspondingly disposed in the red sub-pixel SPX2, the light conversion structure 132c may be correspondingly disposed in the blue sub-pixel SPX3, the light conversion structure 132a may be configured to convert the incident light to a green light, the light conversion structure 132b may be configured to convert the incident light to a red light, and the light conversion structure 132c may be configured to convert the incident light to a light with another wave band (e.g., a blue light with another wave band), but not limited thereto. In detail, in FIG. 2, the light conversion structure 132a and/or the light conversion structure 132b may individually have such as a first part (e.g., 132a_1, 132b_1) and a second part (e.g., 132a_2, 132b_2), wherein the first part 132a_1 and/or the first part 132b_1 may include quantum dots material, the second part 132a_2 and/or the second part 132b_2 may include the color resist. In some embodiments, the incident light emitted by the light emitting structure LS may be a blue light, the first part 132a_1 of the light conversion structure 132a may be configured to convert the blue light to the green light, and the second part 132a_2 may be configured to absorb or filter at least a portion of the incident light which is not converted. The first part 132b_1 of the light conversion structure 132b may be configured to convert the blue light to the red light, and the second part 132b_2 may be configured to absorb or filter at least a portion of the incident light which is not converted. The light conversion structure 132c may include the light scattering particles to increase the scattering effect of the blue light, but not limited thereto. The arrangement of the light conversion structures (e.g., 132a, 132b and/or 132c) is not limited to the above. In some embodiments (not shown), the aforementioned light conversion structure may only include the first part. In some embodiments (not shown), the light conversion structure 132c may optionally include a first part and/or a second part, the first part may be configured to convert the incident light to the blue light having another wave band, and the second part may be configured to absorb or filter at least a portion of the incident light. In some embodiments, the electronic device 100 may further include an optical film such as an anti-reflective layer and/or a polarizer, and the optical film may be disposed at any suitable position.

Moreover (as shown in FIG. 2), the material of the light blocking layer 142 of the aforementioned touch structure TS may include light-blocking material, such as light-absorbing material or light-reflecting material, but not limited thereto. The light blocking layer 142 may include black photoresist, black ink, black resin, pigment, other suitable material or a combination thereof. For instance, the light blocking layer 142 is configured to shield the component below the light blocking layer 142 (e.g., the transistor or trace) or reduce the probability that the ambient light is reflected by the component (e.g., the transistor or trace) of the electronic device, but not limited thereto. In addition, the light blocking layer 142 may have a plurality of openings OP. In the top-view direction Dt, the light emitting regions of the sub-pixels may be defined by the openings OP of the light blocking layer 142. The light blocking layer 142 may be configured to diminish the interference of the lights emitted by the light emitting structures LS corresponding to the different sub-pixels.

In some embodiments, when the user touches the sensing region of the electronic device 100 (i.e., the region containing all of touch structure(s) TS through finger(s) or touch item(s) (e.g., touch pen and/or touch glove), the touch structure(s) TS may sense the touch signal(s), and the touch signal(s) may be transmitted to an operational circuit (e.g., a chip, not shown in figures) through the trace connected to the touch structure(s) TS, thereby calculating the touch position or the touch gesture.

In some embodiments, the electronic device may include a sensing layer 150, and the sensing layer 150 may sense the touch by using a capacitance sensing method, such as a self-capacitance sensing method or a mutual-capacitance sensing method, but not limited thereto. In some embodiments, the sensing layer 150 may use other suitable method to sense the touch.

Referring to FIG. 1 to FIG. 2, in some embodiments, the sensing layer 150 may sense the touch by using the mutual-capacitance sensing method. The sensing layer 150 may include a plurality of first electrodes 156 and a plurality of second electrodes 158, the adjacent first electrodes 156 may be arranged along a third direction D3, the adjacent second electrodes 158 may be arranged along a fourth direction D4, and the third direction D3 intersects with the fourth direction D4. In some embodiments, the third direction D3 may be substantially perpendicular to the fourth direction D4. In some embodiments, a first direction D1, a second direction D2, the third direction D3 and/or the fourth direction D4 may not parallel to each other, but not limited thereto. Note that, in the embodiment shown in FIG. 1 to FIG. 4, the first electrode 156 and/or the second electrode 158 may individually include the first touch layer 152 in a plurality of the touch structures TS. For instance, in the top-view direction Dt, the first touch layer 152 in the touch structures TS within the first electrode 156 are electrically connected to each other, the first touch layer 152 in these touch structures TS within the first electrode 156 may form a mesh structure, but not limited thereto. For instance, in the top-view direction Dt, the first touch layer 152 in the touch structures TS within the second electrode 158 are electrically connected to each other, the first touch layer 152 in these touch structures TS within the second electrode 158 may form a mesh structure, but not limited thereto. In some embodiments (as shown in FIG. 1), the first electrode 156 and the second electrode 158 may include the conductive material of the same conductive layer, but not limited thereto.

Referring to FIG. 1, in some embodiments, the sensing layer 150 may include a first connecting portion 156b (as shown in a coarse dashed line) and a second connecting portion 158b (as shown in a fine line under the coarse dashed line). In some embodiments, the adjacent first electrodes 156 may be electrically connected to each other through the first connecting portion 156b. In some embodiments, the adjacent second electrodes 158 may be electrically connected to each other through the second connecting portion 158b. In some embodiments, the first connecting portion 156b and the second connecting portion 158b may at least partially overlap in the top-view direction Dt, but the first connecting portion 156b and the second connecting portion 158b are insulated from each other. In some embodiments, the first connecting portion 156b and the first electrode 156 may respectively include the different layers; that is to say, the first electrode 156 may be electrically connected to the first connecting portion 156b through at least one conductive hole structure (not shown). In detail, the first connecting portion 156 may be disposed on the first electrode 156, at least one insulating layer (not shown) is disposed between the first electrode 156 and the first connecting portion 156b, at least one insulating layer may have a plurality of vias, the conductive material may be disposed in or filled in these vias to form the conductive hole structures, the first connecting portion 156b may be electrically connected to the adjacent first electrodes 156 through the conductive hole structures. In some embodiments, the conductive material disposed in or filled in the vias may be the same as or different from the material of the first connecting portion 156. In some embodiments (as shown in FIG. 1), the second connecting portion 158b and the second electrode 158 may include the same layer, and the second connecting portion 158b may be electrically connected to the adjacent second electrodes 158, but not limited thereto. In some embodiments, the first electrode 156, the second electrode 158, the first connecting portion 156b and/or the second connecting portion 158b may include opaque conductive material, translucent conductive material, transparent conductive material or a combination thereof. The first electrode 156, the second electrode 158, the first connecting portion 156b and/or the second connecting portion 158b may include metal material (e.g., gold, silver, aluminum, iron, copper, magnesium and/or metal particles, etc.), indium tin oxide (ITO), indium zinc oxide (IZO), other suitable material or a combination thereof, but not limited thereto.

Referring to FIG. 1 to FIG. 2, in some embodiments, the electronic device includes at least two adjacent light conversion structures and at least one touch structure TS, the at least one touch structure TS may be disposed on the light emitting structure LS, the at least one touch structure TS may be between the two adjacent light conversion structures (e.g., 132a, 132b and/or 132c) in the top-view direction Dt, but not limited thereto. In some embodiments, in the top-view direction Dt, the light blocking layer 142 may be a topmost layer in the touch structure TS (i.e., the layer in the touch structure TS is farthest from the first substrate 110), and the cover layer 160 has the light-emitting surface of the electronic device 100 (i.e., the surface which the user views the display image). By the disposition of the light blocking layer 142, the probability that the conductive layer (e.g., the first touch layer 152) in the aforementioned component is shielded may be enhanced, or the probability that the ambient light is reflected from the conductive layer in the aforementioned component is decreased. In some embodiments, the first electrode 156, the second electrode 158, the first connecting portion 156b and/or the second connecting portion 158b is not overlapped with the light emitting region (and/or the light conversion structure 132) of the sub-pixel. In some embodiments, in the top-view direction Dt, the first electrode 156, the second electrode 158, the first connecting portion 156b and/or the second connecting portion 158b may be adjacent to or surrounding the sub-pixel (and/or the light conversion structure (e.g., 132a, 132b and/or 132c)).

FIG. 4 is an enlarge diagram showing a touch layer in a region R of FIG. 1. As shown in FIG. 1 and FIG. 4, in the region where the second electrode 158 is adjacent to the first electrode 156 (e.g., the region R of FIG. 1), the second electrode 158 may partially surround the sub-pixel (e.g., the sub-pixel SPX3), such that a distance S exists between the second electrode 158 and the first electrode 156 in the top-view direction Dt, the distance S may be defined by a minimum distance between the second electrode 158 and the first electrode 156 in the top-view direction Dt. For instance, the distance S is configured to separate the second electrode 158 from the first electrode 156, the second electrode 158 is insulated from the first electrode 156. In some embodiments, in another region where the first electrode 156 is adjacent to the second electrode 158 (not pointed out in FIG. 1), the first electrode 156 partially surrounds the sub-pixel, the distance S exists between the second electrode 158 and the first electrode 156. In some embodiments (as shown in FIG. 4), the distance S may be greater than or equal to a width W1 of the first electrode 156 (e.g., a width of the first touch layer 152 in the first electrode 156) and/or a width W2 of the second electrode 158 (e.g., a width of the first touch layer 152 in the second electrode 158). The aforementioned width W1 and the aforementioned width W2 may be measured by using an optical microscopy (OM) or a scanning electron microscope (SEM) to capture the local region. For instance, under the condition that the measure is performed by using the optical microscopy, the aforementioned width W1 and the aforementioned width W2 may be a greatest width of the first touch layer 152 measured in the captured local region image, the greatest width (referred to the width W1 and/or the width W2 in FIG. 4) is perpendicular to an extending direction of the first touch layer 152 in the first electrode 156 (or the second electrode 158). For instance, under the condition that the measure is performed by using the scanning electron microscope, the aforementioned width W1 and the aforementioned width W2 may be obtained by measuring a greatest width of the first touch layer 152 in the first electrode 156 (or the second electrode 158) in the captured SEM image showing the local region (i.e., the greatest width may be referred to the width W1 of the first touch layer 152 in FIG. 2), wherein the cutting line of this SEM image may be perpendicular to the extending direction of the first touch layer 152 in the first electrode 156 (or the second electrode 158), but not limited thereto.

In some embodiments, the electronic device 100 may optionally include other required layer(s) and/or structure(s). In some embodiments (as shown in FIG. 2), the electronic device 100 may include a pixel defining layer PDL configured to separate the light emitting structures LS corresponding to different sub-pixels, but not limited thereto. In some embodiments, as shown in FIG. 2, the electronic device 100 may include a protecting layer PL1. For example, the protecting layer PL1 is disposed between the light emitting structure LS and the light conversion structure 132a, the light conversion structure 132b and/or the light conversion structures 132c, so as to protect the light emitting structure LS and the light conversion structure(s), thereby reducing the influence upon the light emitting structure LS caused by moisture, oxygen and/or other substances. In some embodiments (as shown in FIG. 2), the protecting layer PL1 may have a flatting function. In some embodiments, the protecting layer PL1 may include a single-layer structure or a multi-layer structure. For example, the protecting layer PL1 may include an inorganic insulating layer, an organic insulating layer or a combination thereof. In some embodiments (as shown in FIG. 2), for instance, the touch structure TS may be disposed on or formed on the protecting layer PL1. In some embodiments (as shown in FIG. 2), in the cross-sectional view, the touch structure TS may have different widths. In some embodiments (as shown in FIG. 2), in the cross-sectional view, the width of one side of the touch structure TS adjacent to the protecting layer PL1 may be greater than or equal to the width of another side of the touch structure TS further from the protecting layer PL1, but not limited thereto. In some embodiments (not shown in figures), the width of one side of the touch structure TS adjacent to the protecting layer PL1 may be less than or equal to the width of another side of the touch structure TS further from the protecting layer PL1.

In some embodiments, in order to decrease the influence and/or damage on the light conversion structures (e.g., 132a, 132b and/or 132c) during the manufacturing process, in the manufacture of the electronic device, the touch structure TS may be disposed before the light conversion structure(s) (e.g., 132a, 132b and/or 132c) may be disposed, but not limited thereto. In some embodiments, the light conversion structure may be protected by suitable method, the touch structure TS may be formed after forming the light conversion structure(s) (e.g., 132a, 132b and/or 132c).

The electronic device of the present disclosure is not limited to the above embodiment(s). Further embodiments of the present disclosure are described below. For ease of comparison, same components will be labeled with the same symbol in the following. The following descriptions relate the differences between each of the embodiments, and repeated parts will not be redundantly described.

Figure 5:
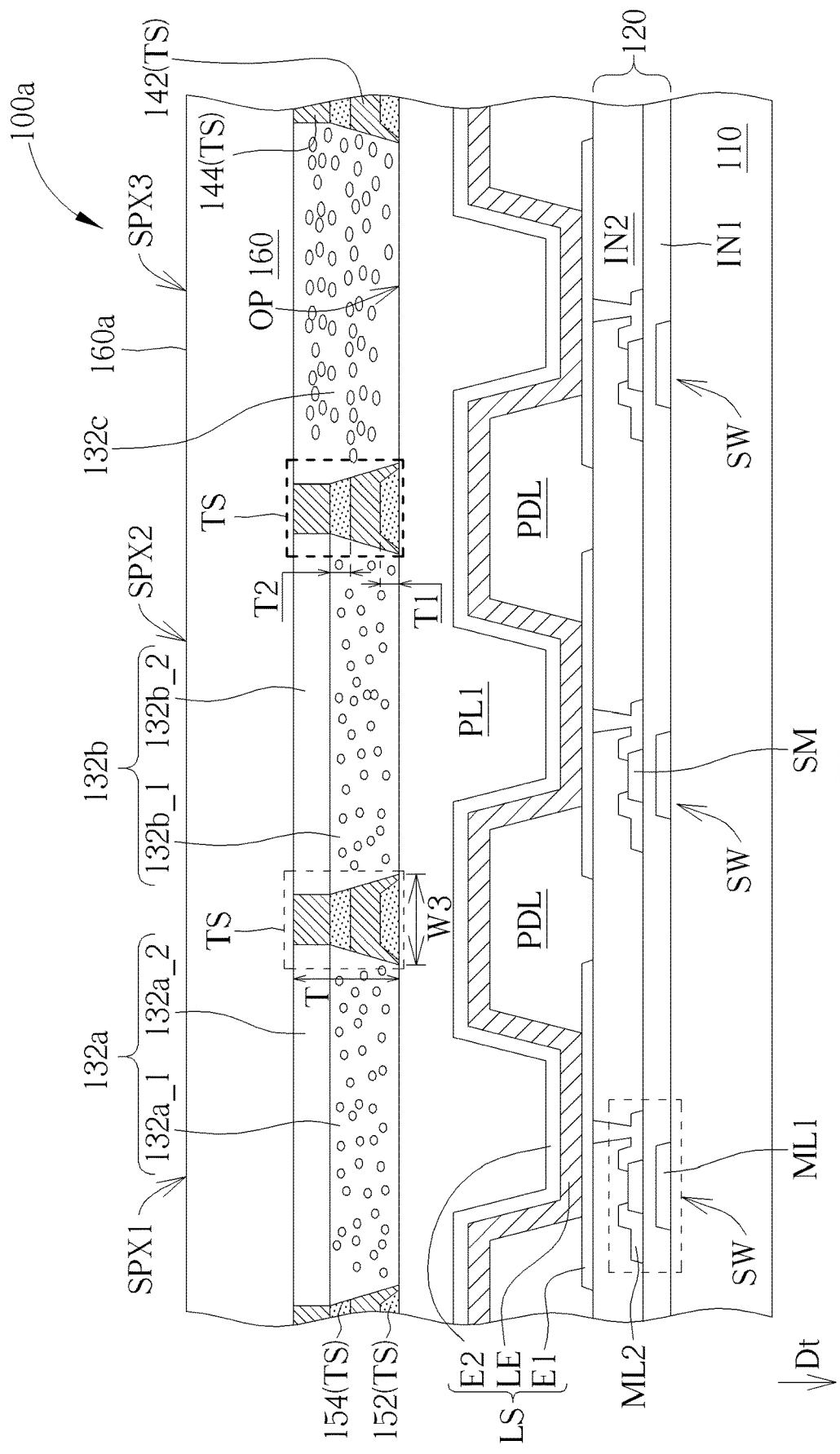
FIG. 5 is a schematic diagram showing a cross-sectional view of an electronic device according to a second embodiment of the present disclosure.

Referring to FIG. 5, FIG. 5 is a schematic diagram showing a cross-sectional view of an electronic device according to a second embodiment of the present disclosure. As shown in FIG. 5, a difference between this embodiment and the first embodiment (shown in FIG. 2) is that the touch structure TS of the electronic device 100a may include a first touch layer 152 and a second touch layer 154, the touch structure TS may further include a light blocking layer 144. In detail, the first touch layer 152, the light blocking layer 142, the second touch layer 154 and the light blocking layer 144 may be disposed on the protecting layer PL1 in sequence, but not limited thereto. In some embodiments (in FIG. 5), in the top-view direction Dt, the first touch layer 152 may be covered by the light blocking layer 142, the second touch layer 154 may be partially covered by the light blocking layer 144, but not limited thereto. Namely, in the top-view direction Dt, a portion of the second touch layer 154 may not overlap the light blocking layer 144, but not limited thereto. In some embodiments (not shown in figures), in the top-view direction Dt, the second touch layer 154 may be covered by the light blocking layer 144. When the touch layer (e.g., the second touch layer 154 or the first touch layer 152) is covered or coated by the light blocking layer 144 and/or the light blocking layer 142, the effect that the touch layer is protected by the light blocking layer is enhanced, such as the unsuitable short circuit between the touch layer and other circuit component is decreased, or the disadvantaged influence on the touch layer caused by moisture and/or oxygen is reduced. In some embodiments (as shown in FIG. 5), the first touch layer 152 may be underneath the light blocking layer 142 with respect to the light emitting structure LS (i.e., based on the position of the light emitting structure LS), and the second touch layer 154 may be underneath the light blocking layer 144 with respect to the light emitting structure LS, but not limited thereto. In some embodiments (as shown in FIG. 5), the light blocking layer 142 may be underneath the second touch layer 154 with respect to the light emitting structure LS (i.e., based on the position of the light emitting structure LS). In some embodiments, the second touch layer 154 may be sandwiched in the light blocking layer or sandwiched between the light blocking layer 142 and the light blocking layer 144, but not limited thereto. The arrangement of the touch layers (the first touch layer 152 and the second touch layer 154) and the light blocking layers (142 and 144) may be designed based on requirement(s). Other possible examples will be described in subsequent embodiments and drawings. In some embodiments (as shown in FIG. 5), the material of the light blocking layer 142 and the material of the light blocking layer 144 may be the same or different; the material of the light blocking layer 142 and/or the material of the light blocking layer 144 includes insulating material. In some embodiments (as shown in FIG. 5), the material of the first touch layer 152 and the material of the second touch layer 154 may be the same or different.

In some embodiments (as shown in FIG. 5), the thickness T of the touch structure TS may be in a range from 3 µm to 35 µm (3 µm≤the thickness T≤35 µm), but not limited thereto. For example, the thickness T of the touch structure TS may be in a range from 3 µm to 17.5 µm (3 µm≤the thickness T≤17.5 µm) or in a range from 18 µm to 35 µm (18 µm≤the thickness T≤35 µm), but not limited thereto. The thickness T of the touch structure TS may be defined by a maximum thickness of the touch structure TS along the top-view direction Dt in the cross-sectional view. For instance (as shown in FIG. 5), the thickness T is a maximum thickness between a surface of the touch structure TS adjacent to the cover layer 160 (e.g., a surface of the light blocking layer 144 to adjacent the cover layer 160) and a surface of the touch structure TS adjacent to the first substrate 110 (e.g., a surface of the light blocking layer 142 adjacent to the first substrate 110). In some embodiments, the thickness T1 of the first touch layer 152 and/or the thickness T2 of the second touch layer 154 may be in a range from about 0.1 µm to about 0.2 µm (0.1 µm≤the thickness T1 or the thickness T2≤0.2 µm). The thickness T1 may be defined by a minimum thickness of the first touch layer 152 along the top-view direction Dt in the cross-sectional view, and the thickness T2 may be defined by a minimum thickness of the second touch layer 154 along the top-view direction Dt in the cross-sectional view. For example, the aforementioned thickness T1 or the aforementioned thickness T2 may be a minimum thickness of the corresponding structure measured in an image of a local region of the corresponding structure captured by the scanning electron microscope (as shown in FIG. 5), but not limited thereto. In some embodiments, the width W3 of the touch structure TS may be in a range from about 1.5 µm to about 12 µm (1.5 µm≤the width W3≤12 µm), but not limited thereto. In some embodiments, the width W3 of the touch structure TS may be in a range from 1.5 µm to 6 µm (1.5 µm≤the width≤6 µm) or from 6 µm to 12 µm (6 µm≤the width W3≤12 µm). The width W3 of the touch structure TS may be defined by a maximum width of the touch structure TS in the cross-sectional view. The aforementioned width W3 of the touch structure TS may be measured by the optical microscopy (OM) or the scanning electron microscope (SEM), but not limited thereto. In some embodiments (as shown in FIG. 5), the side edge of the light blocking layer 142 may be approximately aligned with the side edge of the second touch layer 154, but not limited thereto.

Note that, the touch layer (e.g., the first touch layer 152 and/or the second touch layer 154) and the light blocking layer (e.g., the light blocking layer 142 and/or the light blocking layer 144) are combined to be the touch structure TS according to the design of the present disclosure, so as to reduce the thickness of the electronic device 100 or the distance between the light emitting structure LS and the light conversion structure(s) (e.g., 132a, 132b and/or 132c), and/or decrease the distance between the light emitting structure LS and the light-emitting surface, thereby enhancing the intensity of the light, but not limited thereto. In some embodiments, the electronic device 100 (or 100a) may be a flexible electronic device, the thickness of the electronic device 100 (or 100a) may be decreased according to the aforementioned design. Thus, the flexible electronic device 100 (or 100a) may be bent advantageously.

Figure 6:
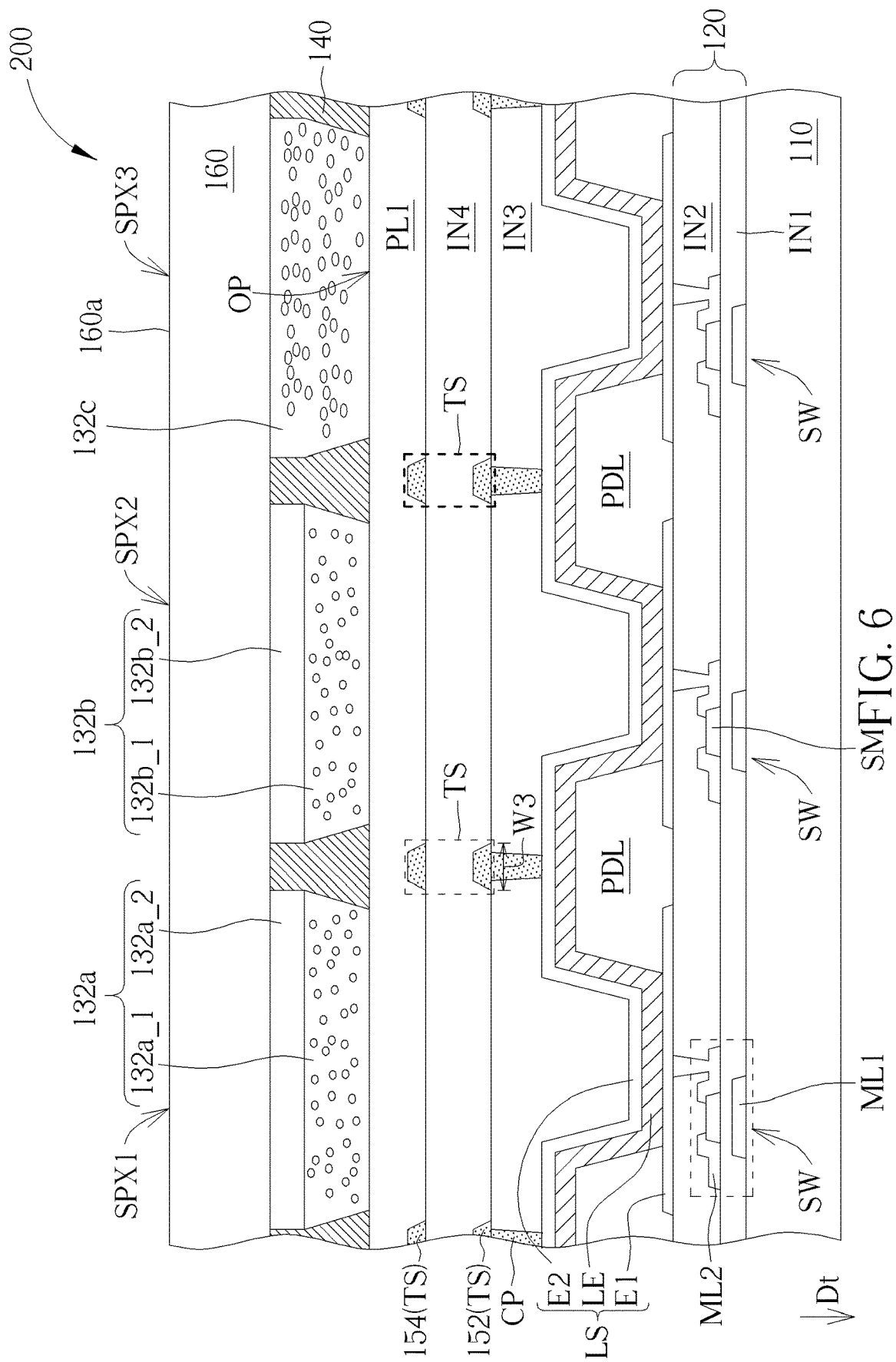
FIG. 6 is a schematic diagram showing a cross-sectional view of an electronic device according to a third embodiment of the present disclosure.

Referring to FIG. 6, FIG. 6 is a schematic diagram showing a cross-sectional view of an electronic device according to a third embodiment of the present disclosure. As shown in FIG. 6, a difference between this embodiment and the first embodiment is that the touch structure TS of the electronic device 200 may be disposed between the light emitting structure LS and the light conversion structure(s) (e.g., 132a, 132b and/or 132c). In detail, in FIG. 6, the touch structure TS may include a first touch layer 152 and a second touch layer 154, and a portion of an insulating layer IN4 is disposed between the first touch layer 152 and the second touch layer 154 to separate the first touch layer 152 from the second touch layer 154. The first touch layer 152 and the second touch layer 154 are formed to be a capacitor for sensing. Moreover, the electronic device 200 may include an insulating layer IN3 disposed between the first touch layer 152 and the light emitting structure LS, and the insulating layer IN3 may have a flatting function to facilitate the disposition of the touch structure TS, such that a difference between these capacitors (including the touch structure TS) may be decreased. In some embodiments (as shown in FIG. 6), the touch structure TS is underneath a light blocking structure 140 with respect to the light emitting structure LS (i.e., based on the position of the light emitting structure LS), and the touch structure TS does not include the aforementioned light blocking layer. In some embodiments (as shown in FIG. 6), in the top-view direction Dt, the touch structure TS (including the first touch layer 152 and/or the second touch layer 154) may be overlapped with the light blocking structure 140. In some embodiments (as shown in FIG. 6), in the top-view direction Dt, the touch structure TS (the first touch layer 152 and/or the second touch layer 154) may not be overlapped with the light conversion structure (e.g., 132a, 132b and/or 132c) and/or the light emitting structure LS. In some embodiments (as shown in FIG. 6), in the top-view direction Dt, the touch structure TS is disposed between two adjacent light conversion structures (e.g., 132a, 132b and/or 132c). In some embodiments, the insulating layer IN4 may include an inorganic insulating layer, an organic insulating layer or a combination thereof.

In some embodiments (as shown in FIG. 6), the first touch layer 152 may serve as an auxiliary electrode of the light emitting structure LS. In detail, in FIG. 6, the first touch layer 152 may be electrically connected to the light emitting structure LS (e.g., the second electrode E2) through a connecting element CP. In some embodiments (as shown in FIG. 6), the insulating layer IN3 may have a via (not shown in figures) exposing at least a portion of a surface of the light emitting structure LS (e.g., the second electrode E2), and/or conductive material may be disposed in or filled in this via to form the connecting element CP, but not limited thereto. In some embodiments, the material of the connecting element CP may include any suitable conductive material, and the material of the connecting element CP may be the same as or different from the first touch layer 152. In some embodiments (not shown), the first touch layer 152 of the electronic device 200 may be disposed on the second electrode E2 of the light emitting structure LS and be in contact with the second electrode E2, so as to serve as the auxiliary electrode of the light emitting structure LS. In some embodiments, the material of the first touch layer 152 may include metal material to decrease the resistance and/or increase the transmission effect of the signal transmitting to the light emitting structure LS (e.g., the second electrode E2). For instance, the signal may be evenly transmitted to the light emitting structure LS. In some embodiments, the first touch layer 152 may not be electrically connected to the light emitting structure LS (e.g., the second electrode E2), the first touch layer 152 may not serve as the auxiliary electrode, and another auxiliary electrode (not shown in figures) may be optionally included in the electronic device.

In some embodiments, the electronic device may be a touch display device, the touch sensing function and a display function may be respectively performed in different time segments. In the touch sensing time segment, the first touch layer 152 and/or the second touch layer 154 may be configured to receive the touch signal(s), the touch signal(s) may be transmitted to the operational circuit (not shown in figures) through the trace(s) (not shown in figures) connected to the first touch layer 152 and/or the second touch layer 154. In the display time segment, when the first touch layer 152 serves as the auxiliary electrode, a voltage source may transmit a voltage to the second electrode E2 through the first touch layer 152, but not limited thereto. The voltage may include common voltage (Vcom) or other suitable voltage. In some embodiments (not shown in figures), the touch structure TS of the electronic device 200 may sense the touch by using a self-capacitance sensing method. Therefore, the touch structure TS may include only one touch layer (e.g., one of the aforementioned first touch layer 152 and the aforementioned second touch layer 154).

Figure 7:
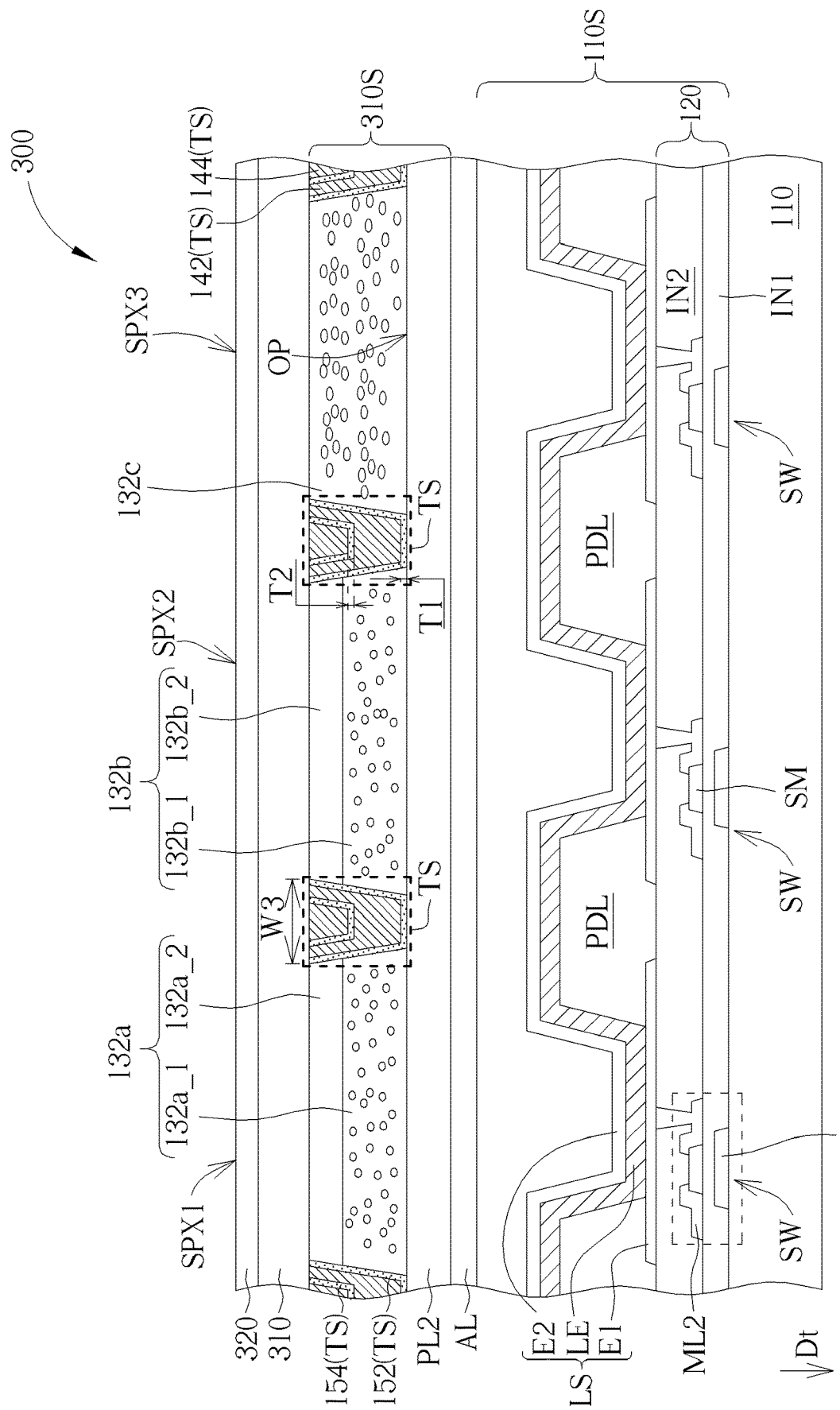
FIG. 7 is a schematic diagram showing a cross-sectional view of an electronic device according to a fourth embodiment of the present disclosure.

Referring to FIG. 7, FIG. 7 is a schematic diagram showing a cross-sectional view of an electronic device according to a fourth embodiment of the present disclosure. As shown in FIG. 7, a difference between this embodiment and the first embodiment is that the electronic device 300 of this embodiment includes a second substrate 310 opposite to the first substrate 110. A first substrate structure 110S is disposed on the first substrate 110, the first substrate structure 110S is defined by a combination containing the layers (and/or structures) disposed on or formed on the first substrate 110. A second substrate structure 310S is disposed on the second substrate 310, the second substrate structure 310S is defined by a combination containing the layers (and/or structures) disposed on or formed on the second substrate 310. In some embodiments (as shown in FIG. 7), the first substrate structure 110S and the second substrate structure 310S may be adhered to each other by an adhesive layer AL. In some embodiments (as shown in FIG. 7), the first substrate structure 110S may include the circuit component layer 120 and/or the light emitting structure LS, the second substrate structure 310S may include the light conversion structures (e.g., 132a, 132b and/or 132c) and/or the touch structure TS, but not limited thereto. In some embodiments, the second substrate structure 310S may further include a protecting layer PL2 disposed between the adhesive layer AL and the light conversion structure(s) (e.g., 132a, 132b and/or 132c) to protect the light conversion structure(s) (e.g., 132a, 132b and/or 132c), the touch structure TS and/or the light blocking layer(s) (144 and/or 142). Note that the layers (or structures) in the first substrate structure 110S and/or the layers (or structures) in the second substrate structure 310S may be adjusted based on requirement(s). For instance, a portion of the layers (or structures) may be removed optionally or other additional layer(s) (or structure(s)) may be added. Moreover, the material of the second substrate 310 may be the same as or different from the first substrate 110, and this will not be redundantly described.

Referring to FIG. 7, in some embodiments, in the cross-sectional view, the touch structure TS may have different widths. In other words, a width of one side of the touch structure TS adjacent to the second substrate 310 may be greater than or equal to a width of another side of the touch structure TS further from the second substrate 310. In some embodiments, the second touch layer 154 of the touch structure TS may be sandwiched between the light blocking layer 142 and the light blocking layer 144. In some embodiments, in the cross-sectional view, the cross-sectional shape of the first touch layer 152 and/or the cross-sectional shape of the second touch layer 154 may be U-type shape or other suitable shape. In some embodiments, in the cross-sectional view, the cross-sectional shape of the first touch layer 152 and the cross-sectional shape of the second touch layer 154 may be the same or different. In some embodiments, an area of the second touch layer 154 projected to the second substrate 310 may be less than an area of the first touch layer 152 projected to the second substrate 310, but not limited thereto. In some embodiments, the second touch layer 154 may not be in contact with the light conversion structure (e.g., 132a, 132b and/or 132c). In some embodiments (not shown in figures), the first touch layer 152 may not be in contact with the light conversion structure (e.g., 132a, 132b and/or 132c).

In some embodiments (as shown in FIG. 7), in the top-view direction Dt, a portion of the first touch layer 152 and/or a portion of the second touch layer 154 may not be covered by the light blocking layer 142 and/or the light blocking layer 144. In order to decrease ambient light reflected by the first touch layer 152 and/or the second touch layer 154 in the touch structure TS, a polarizer 320 or an anti-reflective layer (not shown in figures) may be disposed on the second substrate 310 or the touch structure TS, but not limited thereto. In some embodiments (not shown), the first touch layer 152 may be electrically connected to the light emitting structure LS (e.g., the second electrode E2) of the first substrate structure 110S through a connecting element to serve as an auxiliary electrode of the light emitting structure LS.

In some embodiments, the touch structure TS may be included in the second substrate structure 310S. For instance, the first touch layer 152 may be disposed between the protecting layer PL2 and the light blocking layer 142, and the second touch layer 154 is disposed between the light blocking layer 142 and the second substrate 310, but not limited thereto. In some embodiments (not shown), the first touch layer 152 may be included in the first substrate structure 110S, and the second touch layer 154 may be included in the second substrate structure 310S.

Figure 8:
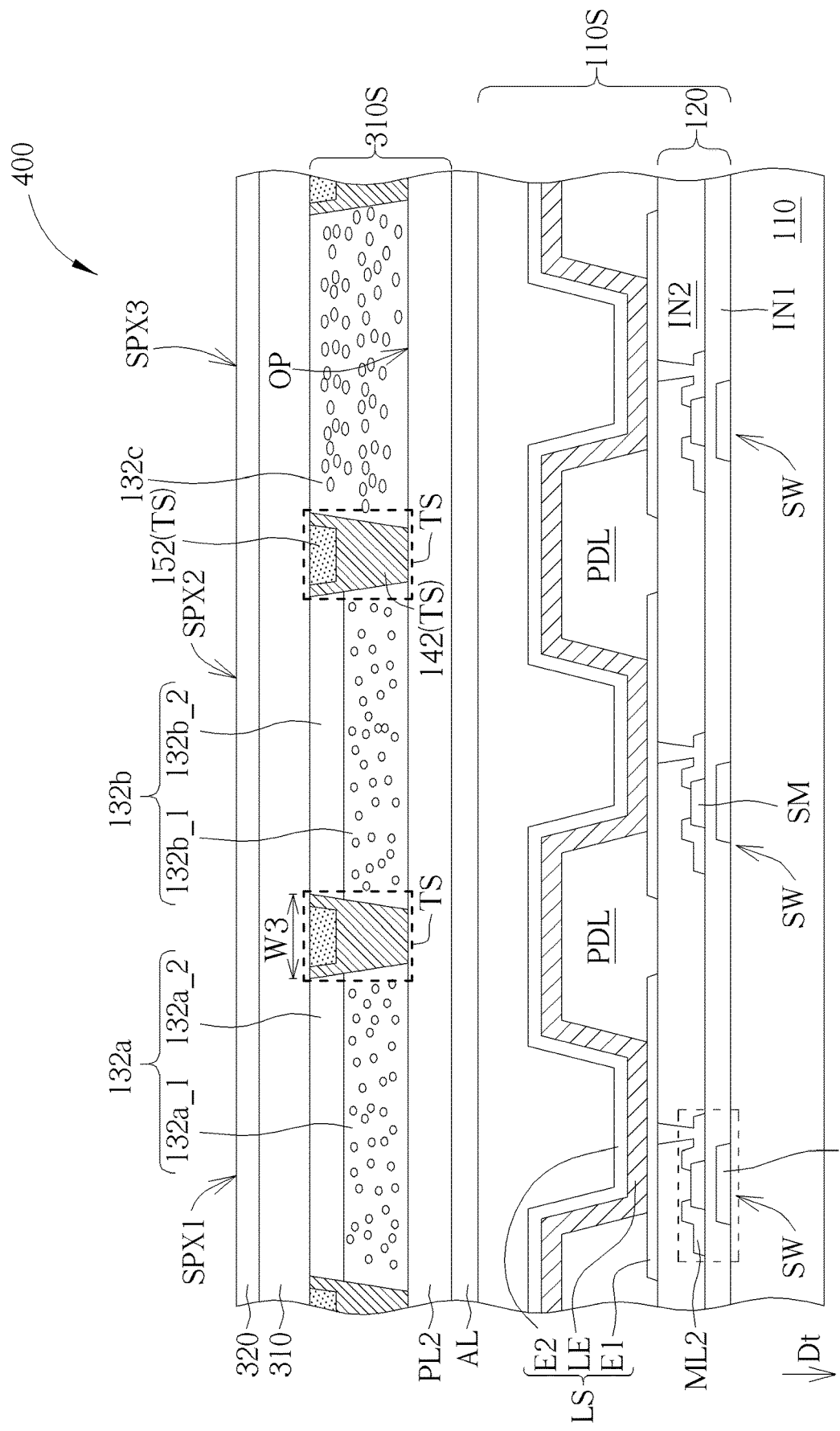
FIG. 8 is a schematic diagram showing a cross-sectional view of an electronic device according to a fifth embodiment of the present disclosure.

Referring to FIG. 8, FIG. 8 is a schematic diagram showing a cross-sectional view of an electronic device according to a fifth embodiment of the present disclosure. As shown in FIG. 8, a difference between this embodiment and the fourth embodiment is that the touch structure TS the electronic device 400 of this embodiment may sense the touch by using a self-capacitance sensing method, the touch structure TS of the electronic device 400 may include the first touch layer 152. In some embodiments (as shown in FIG. 8), the light blocking layer 142 may be underneath the first touch layer 152 with respect to the light emitting structure LS, but not limited thereto. In some embodiments (as shown in FIG. 8), in the top-view direction Dt, the upper side of the touch structure TS is not covered by the light blocking layer 142, in order to decrease the ambient light reflected by the touch structure TS, a polarizer 320 or a an anti-reflective layer (not shown) may be disposed on the second substrate 310 or the touch structure TS.

Figure 9:
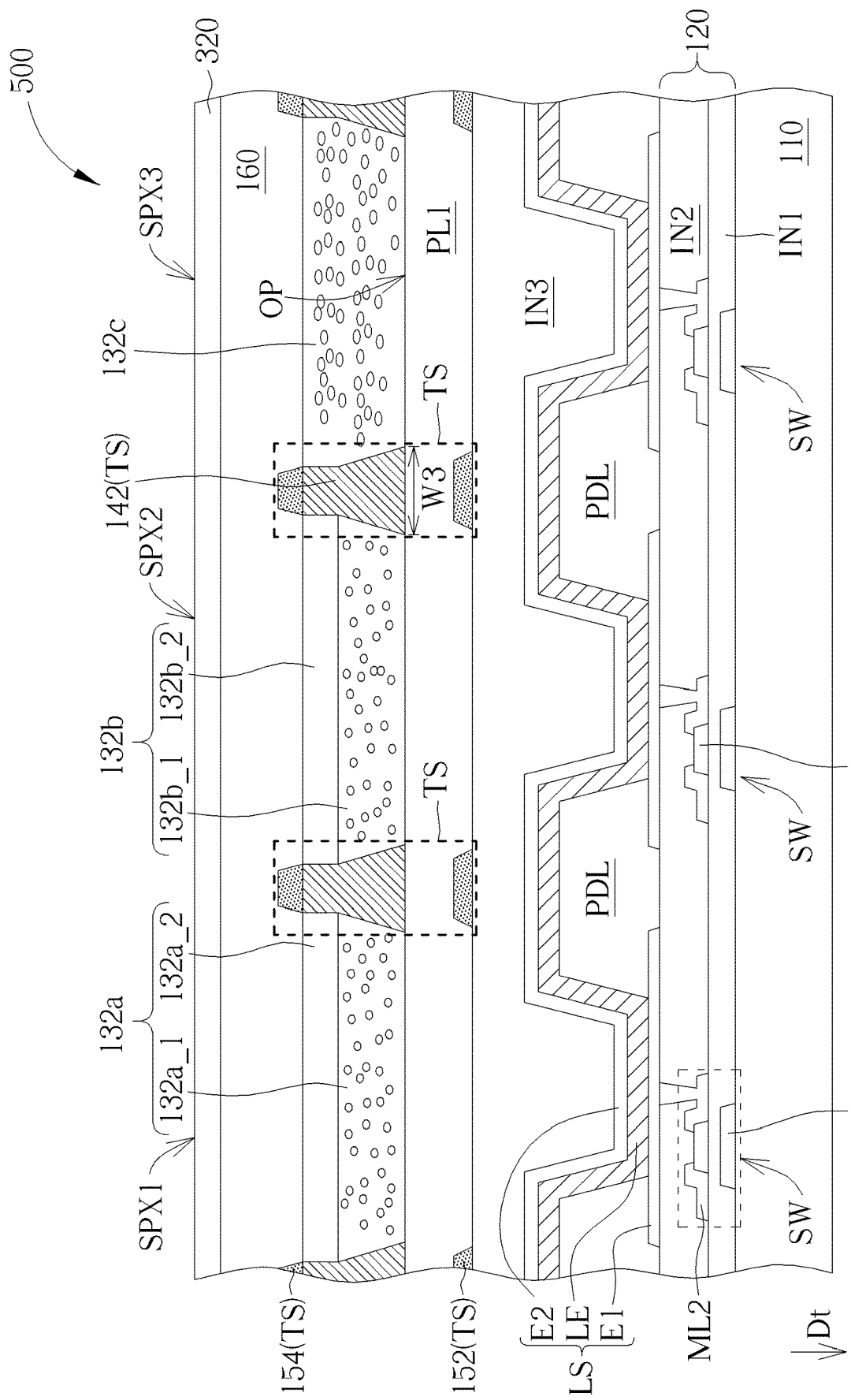
FIG. 9 is a schematic diagram showing a cross-sectional view of an electronic device according to a sixth embodiment of the present disclosure.

Referring to FIG. 9, FIG. 9 is a schematic diagram showing a cross-sectional view of an electronic device according to a sixth embodiment of the present disclosure. As shown in FIG. 9, a difference between this embodiment and the first embodiment is the disposition of the touch structure TS of the electronic device 500. In FIG. 9, the first touch layer 152 of the touch structure TS may be disposed between the light emitting structure LS and the protecting layer PL1, the second touch layer 154 may be disposed between the light blocking layer 142 and the cover layer 160, the light blocking layer 142 and/or the protecting layer PL1 may be disposed between the first touch layer 152 and the second touch layer 154, but not limited thereto. The first touch layer 152 may be underneath the light blocking layer 142 with respect to the light emitting structure LS, and the light blocking layer 142 may be underneath the second touch layer 154 with respect to the light emitting structure LS. In some embodiments (as shown in FIG. 9), the touch structure TS may include the first touch layer 152, the second touch layer 154, the light blocking layer 142 and/or a portion of the protecting layer PL1, and the touch structure TS may be between two adjacent light conversion structures (e.g., 132a, 132b and/or 132c) in the top-view direction Dt.

Figure 10:
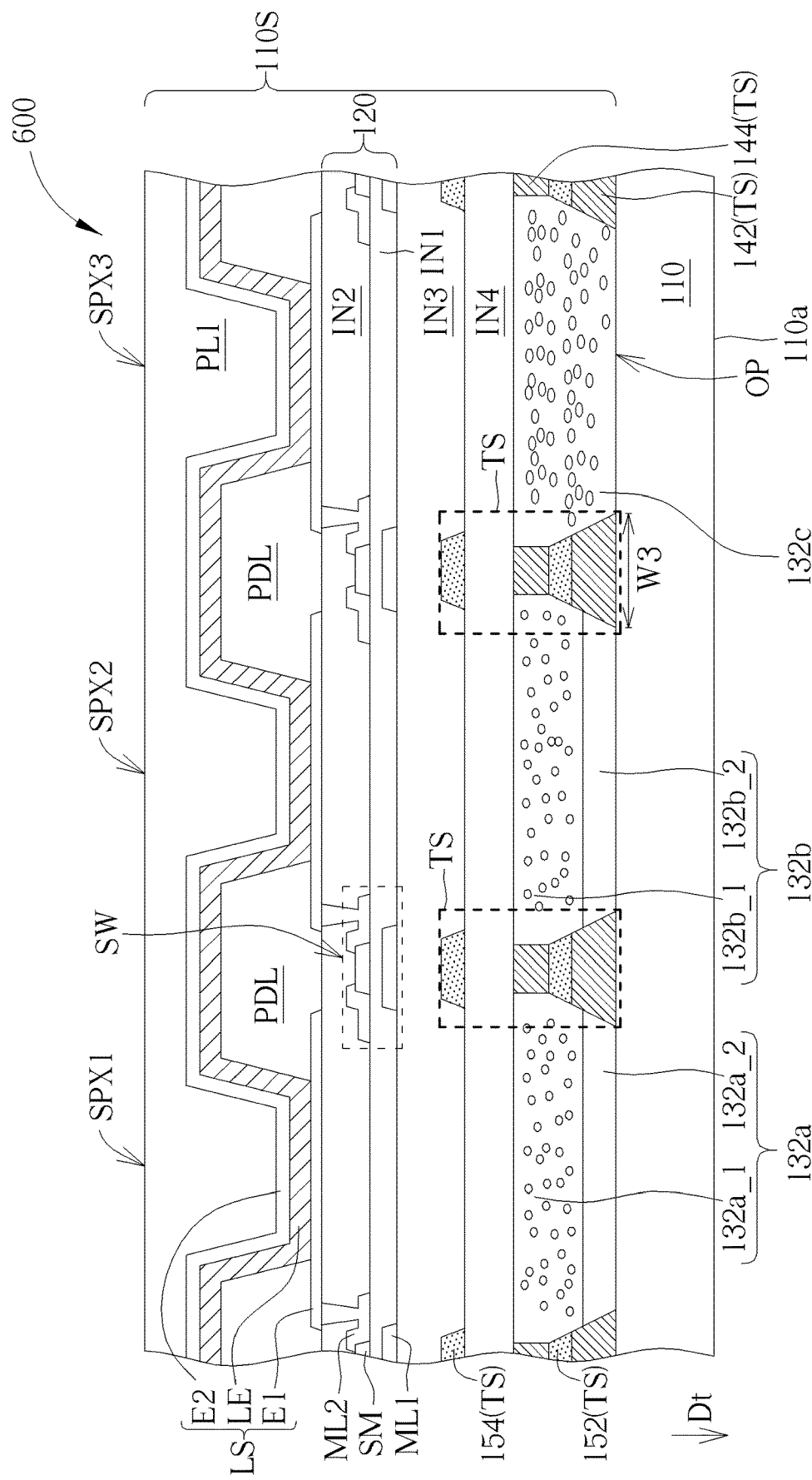
FIG. 10 is a schematic diagram showing a cross-sectional view of an electronic device according to a seventh embodiment of the present disclosure.

Referring to FIG. 10, FIG. 10 is a schematic diagram showing a cross-sectional view of an electronic device according to a seventh embodiment of the present disclosure. As shown in FIG. 10, a difference between this embodiment and the first embodiment is that the electronic device 600 of this embodiment emits the light downwardly. That is to say, an outer surface 110a of the first substrate 110 is the light-emitting surface of the electronic device 600 (i.e., a surface which the user views the display image), the outer surface 110a of the first substrate 110 may be a surface for touch, but not limited thereto. In some embodiments (as shown in FIG. 10), the light blocking layer 142, the light blocking layer 144 and/or the light conversion structures (e.g., 132a, 132b and/or 132c) may be included in the first substrate structure 110S, but not limited thereto. In some embodiments, the light blocking layer 142, the light blocking layer 144 and/or the light conversion structures (e.g., 132a, 132b and/or 132c) may be disposed between the first substrate 110 and the circuit component layer 120 (or the light emitting structure LS). In some embodiments (as shown in FIG. 10), the electronic device 600 may emit the light downwardly, the electronic component(s) (e.g., the switching component SW, a data line (not shown in figures) and/or a scanning line (not shown in figures), but not limited thereto) may not overlap the light emitting structure LS in the top-view direction Dt, thereby enhancing the intensity of the light or enhancing the viewing quality of the display image. In some embodiments (as shown in FIG. 10), the electronic component(s) may overlap the light blocking layer 142 and/or the light blocking layer 144 in the top-view direction Dt, thereby decreasing the probability that the ambient light is reflected by the electronic component(s). In some embodiments (as shown in FIG. 10), the electronic device 600 may emit the light downwardly, the first electrode E1 may include transparent conductive material, and the second electrode E2 may include metal, the second electrode E2 may be configured to reflect the light produced by the light-emitting layer LE, but not limited thereto. In some embodiments (as shown in FIG. 10), the touch structure TS may be included in the first substrate structure 110S, and the touch structure TS may have different widths in the cross-sectional view. In other words, a width of one side of the touch structure TS adjacent to the first substrate 110 may be greater than or equal to a width of another side of the touch structure TS further from the first substrate 110, but not limited thereto.

In FIG. 10, an insulating layer IN3 may be disposed between the switching component SW and the touch structure TS to separate the switching component SW and the touch structure TS, thereby making the switching component SW and the touch structure TS be insulated from each other. In addition, an insulating layer IN4 and/or a light blocking layer 144 may be disposed between the second touch layer 154 and the first touch layer 152, and the second touch layer 154 and the first touch layer 152 are separated from each other by the insulating layer IN4 and/or the light blocking layer 144 to form a capacitor, but not limited thereto.

Figure 11:
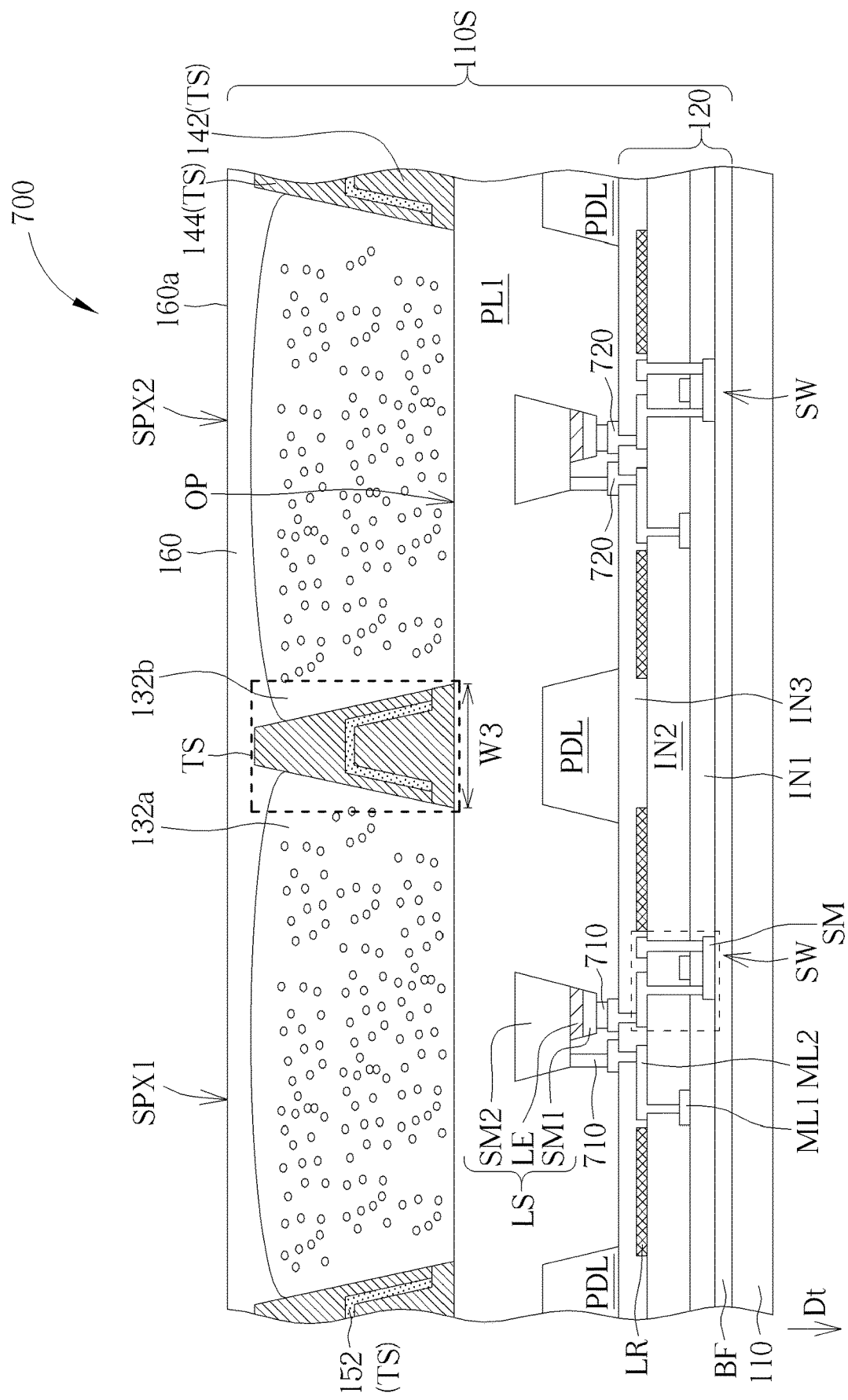
FIG. 11 is a schematic diagram showing a cross-sectional view of an electronic device according to an eighth embodiment of the present disclosure.

Referring to FIG. 11, FIG. 11 is a schematic diagram showing a cross-sectional view of an electronic device according to an eighth embodiment of the present disclosure, FIG. 11 only shows the green sub-pixel SPX1 and the red sub-pixel SPX2, but not limited thereto. As shown in FIG. 11, a difference between this embodiment and the first embodiment is that the light emitting structure LS of the electronic device 700 of this embodiment may be a light-emitting diode (including micro-LED and/or a mini-LED, but not limited thereto). The light-emitting diode may include a first semiconductor layer SM1, a second semiconductor layer SM2 and a light-emitting layer LE disposed between the first semiconductor layer SM1 and the second semiconductor layer SM2, the first semiconductor layer SM1 and the second semiconductor layer SM2 may be respectively bonded to the bonding pads 720 on the first substrate 110 through connecting elements 710, but not limited thereto. The layers in the light-emitting diode may be adjusted based on requirement(s). Furthermore, in order to enhance the light utilization efficiency of the light-emitting diode, the circuit component layer 120 may include a reflecting layer LR configured to make a portion of the light emitted from the light emitting structure LS be reflected upwardly. In some embodiments (as shown in FIG. 11), the reflecting layer LR may be formed of the conductive layer ML2, but not limited thereto. In some embodiments (not shown in figures), the reflecting layer LR may be disposed on (or may cover) the pixel defining layer PDL. In some embodiments (as shown in FIG. 11), the electronic device 700 may include a buffer layer BF disposed between the first substrate 110 and the switching component SW, but not limited thereto.

In FIG. 11, for example, the touch structure TS may sense the touch by using a self-capacitance sensing method, the electronic device 700 may include the first touch layer 152, and a portion of the first touch layer 152 may be sandwiched between the light blocking layer 142 and the light blocking layer 144. In some embodiments (not shown), a portion of the first touch layer 152 may be exposed to be connected to other electronic component (not shown), wherein this electronic component may include a chip, a (soft or rigid) circuit board, but not limited thereto.

Figure 12:
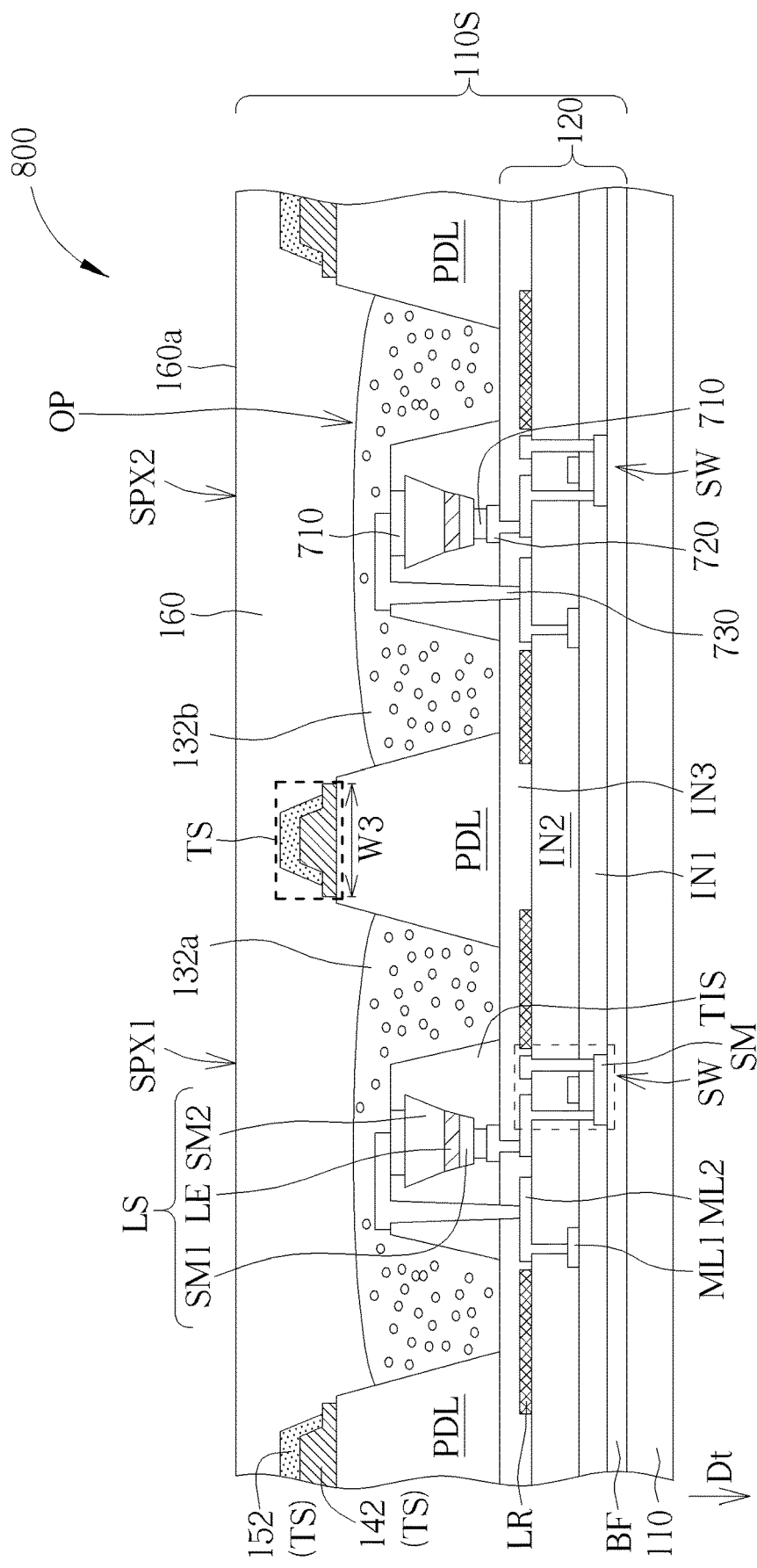
FIG. 12 is a schematic diagram showing a cross-sectional view of an electronic device according to a ninth embodiment of the present disclosure.

Referring to FIG. 12, FIG. 12 is a schematic diagram showing a cross-sectional view of an electronic device according to a ninth embodiment of the present disclosure, wherein FIG. 12 only shows the green sub-pixel SPX1 and the red sub-pixel SPX2, but not limited thereto. As shown in FIG. 12, a difference between this embodiment and the eighth embodiment is the type of the light-emitting diode of the electronic device 800. In FIG. 12, the light emitting structure LS may include a vertical type light-emitting diode. In some embodiments, the light conversion structures (e.g., 132a, 132b and/or 132c) may be included in the first substrate structure 110S, the light conversion structure (e.g., 132a, 132b and/or 132c) may be adjacent to and/or cover the light emitting structure LS, a transparent insulating structure TIS may be optionally disposed between the light conversion structure (e.g., 132a, 132b and/or 132c) and the light emitting structure LS, but not limited thereto. In some embodiments (as shown in FIG. 12), the light emitting structure LS may include the first semiconductor layer SM1, the second semiconductor layer SM2 and the light-emitting layer LE disposed between the first semiconductor layer SM1 and the second semiconductor layer SM2, the first semiconductor layer SM1 may be bonded to the bonding pad 720 through the connecting element 710, and the second semiconductor layer SM2 may be connected to the conductive layer ML2 through the connecting element 710 and the connecting element 730, but not limited thereto. The layers in the light-emitting diode be adjusted based on requirement(s). In some embodiments (as shown in FIG. 12), the pixel defining layer PDL may include single-layer structure or a composite layer structure. For instance, the pixel defining layer PDL may include insulating material, reflective material, other suitable material or a combination thereof, but not limited thereto. As an example, the pixel defining layer PDL may be an insulating structure coated with the reflective material, the reflective material may be disposed on a side face of the pixel defining layer PDL adjacent to the light conversion structure (e.g., 132a, 132b and/or 132c) to increase the probability that the light is reflected to the light conversion structure for being converted, thereby enhancing the light converting efficiency.

Figure 13:
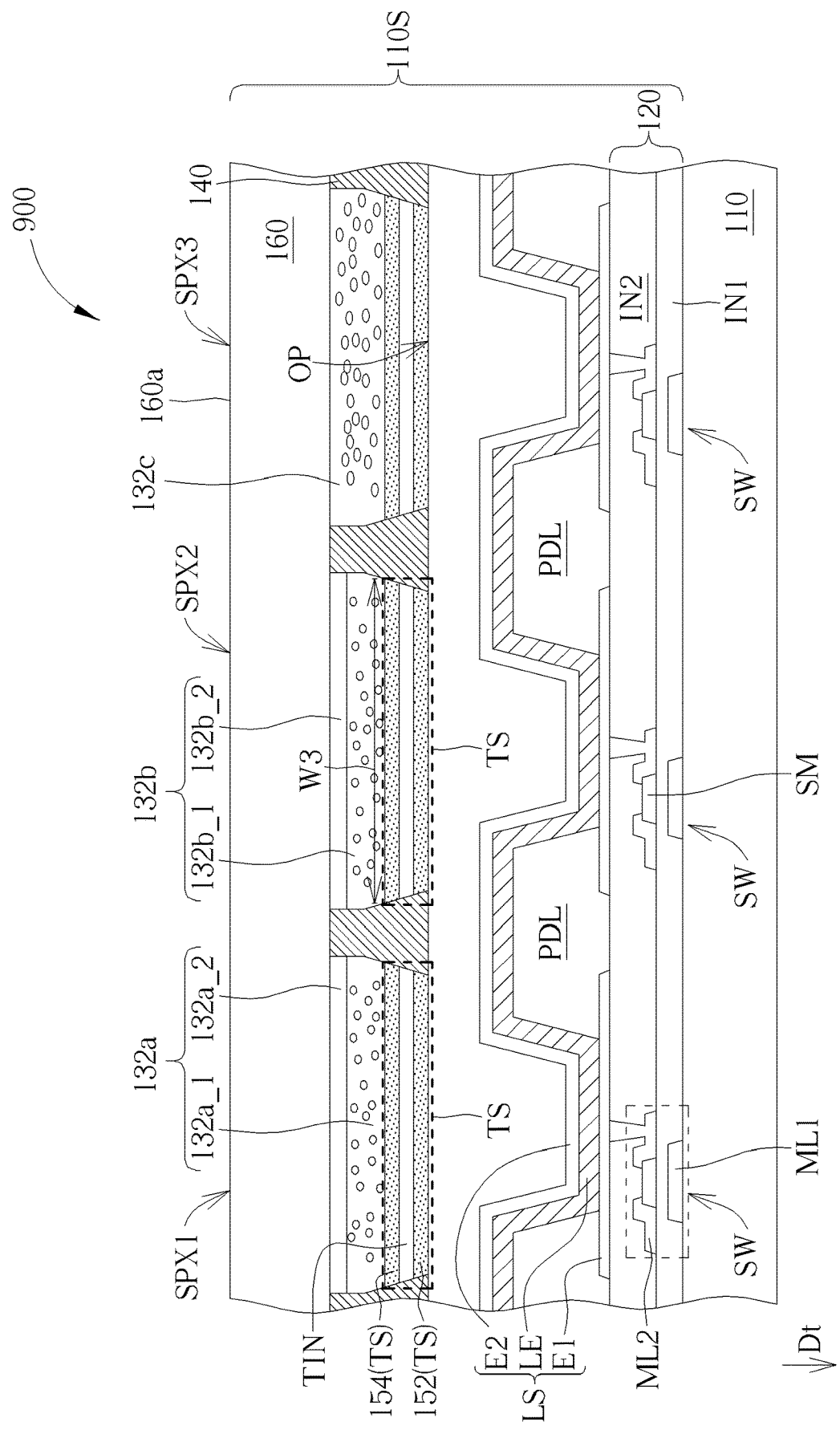
FIG. 13 is a schematic diagram showing a cross-sectional view of an electronic device according to a tenth embodiment of the present disclosure.

Referring to FIG. 13, FIG. 13 is a schematic diagram showing a cross-sectional view of an electronic device according to a tenth embodiment of the present disclosure. As shown in FIG. 13, a difference between this embodiment and the first embodiment is that the touch structure TS of the electronic device 900 of this embodiment may be overlapped with at least one of the light conversion structures (e.g., 132a, 132b and/or 132c) or the light emitting structure LS in the top-view direction Dt, and the first touch layer 152 and/or the second touch layer 154 of the touch structure TS may include transparent conductive material. In some embodiments (as shown in FIG. 13), the touch structure TS may sense the touch by using a mutual-capacitance sensing method, the touch structure TS may include a first touch layer 152, a second touch layer 154 and a portion of a transparent insulating layer TIN disposed between the first touch layer 152 and the second touch layer 154. In some embodiments (as shown in FIG. 13), the touch structure TS may be correspondingly disposed in the opening OP of the light blocking structure 140. That is to say, the light blocking structure 140 may be adjacent to or surrounding the touch structure TS, but not limited thereto. In some embodiments (as shown in FIG. 13), the touch structure TS may be disposed between the light conversion structure (e.g., 132a, 132b and/or 132c) and the light emitting structure LS, but not limited thereto. In some embodiments (not shown in figures), in the top-view direction Dt, the touch structure TS may be overlapped with the light conversion structure (e.g., 132a, 132b and/or 132c), the light conversion structure (e.g., 132a, 132b and/or 132c) may be disposed between the touch structure TS and the light emitting structure LS. The touch structure TS may be more adjacent to the light-emitting surface than the light conversion structure (e.g., 132a, 132b and/or 132c). In some embodiments (not shown), the first touch layer 152 and the second touch layer 154 may be respectively disposed on two sides of the light conversion structure (e.g., 132a, 132b and/or 132c), and the first touch layer 152 and the second touch layer 154 may be separated by the light conversion structure to form a capacitor, but not limited thereto.

Note that, the above embodiments sense the touch by using the self-capacitance sensing method or the mutual-capacitance sensing method optionally, and the touch structure TS may optionally include one touch layer or a plurality of touch layers based on the type of the sensing method. The present disclosure does not limit the sensing method and the touch layer number in the touch structure TS. In summary, the present disclosure provides the electronic device having the light conversion structure and the touch structure, and the light conversion structure and the touch structure are integrated into a panel, but not limited thereto.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

What is claimed is:

1. An electronic device, comprising:
a light emitting structure;
at least one touch structure disposed on the light emitting structure, wherein the at least one touch structure comprises a touch layer;
at least two adjacent light conversion structures; and
a plurality of first electrodes comprising the touch layer, wherein one of the plurality of first electrodes surrounds at least one of the at least two adjacent light conversion structures in a top view;
wherein the at least one touch structure is between the at least two adjacent light conversion structures.

2. The electronic device according to claim 1, wherein the at least one touch structure comprises a light blocking layer.

3. The electronic device according to claim 2, wherein the touch layer is underneath the light blocking layer with respect to the light emitting structure.

4. The electronic device according to claim 2, wherein the light blocking layer is underneath the touch layer with respect to the light emitting structure.

5. The electronic device according to claim 2, wherein the touch layer is sandwiched in the light blocking layer.

* * * * *